United States Patent
Chung et al.

(10) Patent No.: US 12,557,561 B2
(45) Date of Patent: Feb. 17, 2026

(54) HALL EFFECT DEVICE WITH TRENCH ABOUT A MICRON OR GREATER IN DEPTH

(71) Applicant: Allegro MicroSystems, LLC, Manchester, NH (US)

(72) Inventors: Thomas S. Chung, Merrimack, NH (US); Maxim Klebanov, Palm Coast, FL (US); Sundar Chetlur, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 884 days.

(21) Appl. No.: 17/807,196

(22) Filed: Jun. 16, 2022

(65) Prior Publication Data
US 2023/0413687 A1 Dec. 21, 2023

(51) Int. Cl.
*H10N 52/80* (2023.01)
*G01R 33/07* (2006.01)
*H10N 50/85* (2023.01)
*H10N 52/00* (2023.01)

(52) U.S. Cl.
CPC ........... *H10N 52/80* (2023.02); *G01R 33/077* (2013.01); *H10N 50/85* (2023.02); *H10N 52/101* (2023.02)

(58) Field of Classification Search
CPC ...... H10N 52/80; H10N 50/85; H10N 52/101; H10N 59/00; H10N 52/01; H10N 52/00; H10N 52/85; G01R 33/077; G01R 33/0005; G01R 33/07
See application file for complete search history.

(56) References Cited

U.S. PATENT DOCUMENTS

| | | | |
|---|---|---|---|
| 4,264,382 A | 4/1981 | Anantha et al. |
| 6,020,623 A | 2/2000 | Chiozzi |
| 6,034,413 A | 3/2000 | Hastings et al. |
| 6,828,644 B2 | 12/2004 | Asano et al. |
| 7,397,101 B1 | 7/2008 | Masini et al. |
| 8,384,183 B2 | 2/2013 | Wong et al. |
| 9,099,638 B2 | 8/2015 | Wang et al. |
| 9,312,473 B2 | 4/2016 | Kosier et al. |
| 9,318,481 B1 | 4/2016 | Wang et al. |
| 9,368,486 B2 | 6/2016 | Wang et al. |

(Continued)

OTHER PUBLICATIONS

Lee, et al. "A miniaturized high-voltage solar cell array as an electrostatic MEMS power supply;" Journal of Microelectromechanical Systems; vol. 4, Issue 3; Sep. 1995; 7 Pages.

(Continued)

*Primary Examiner* — Latanya N Crawford Eason
(74) *Attorney, Agent, or Firm* — DALY, CROWLEY, MOFFORD & DURKEE LLP

(57) ABSTRACT

In one aspect, a Hall effect device includes an implantation layer; an epitaxial layer located above the implantation layer; a trench filled with a dielectric material and extending from a top surface of the epitaxial layer into the implantation layer and defining an enclosed region; a buried layer the epitaxial layer from the implantation layer within the enclosed region; and a contact pad located on the epitaxial layer. The trench reduces a current from the contact pad from traveling in a lateral direction orthogonal to a vertical direction and enables the current to travel in the vertical direction.

28 Claims, 2 Drawing Sheets

(56) References Cited

U.S. PATENT DOCUMENTS

| | | | |
|---|---|---|---|
| 9,548,443 | B2 | 1/2017 | Wang |
| 10,468,485 | B2 | 11/2019 | Chetlur et al. |
| 10,916,438 | B2 | 2/2021 | Klebanov et al. |
| 10,943,976 | B2 | 3/2021 | Chetlur et al. |
| 11,029,366 | B2 | 6/2021 | Briano |
| 11,195,826 | B2 | 12/2021 | Klebanov et al. |
| 11,217,718 | B2 | 1/2022 | Cadugan et al. |
| 11,296,247 | B2 | 4/2022 | Cadugan et al. |
| 2004/0173875 | A1 | 9/2004 | Yamamoto et al. |
| 2005/0184354 | A1 | 8/2005 | Chu et al. |
| 2007/0170537 | A1 | 7/2007 | Poenar et al. |
| 2008/0083963 | A1 | 4/2008 | Hsu et al. |
| 2010/0252900 | A1* | 10/2010 | Minixhofer .......... H10N 52/101 257/421 |
| 2019/0259936 | A1* | 8/2019 | Liu ........................ H10N 52/01 |
| 2019/0288132 | A1 | 9/2019 | Wang et al. |
| 2020/0259038 | A1 | 8/2020 | Natsuai et al. |
| 2021/0286025 | A1* | 9/2021 | Sun ........................ H10B 61/00 |

OTHER PUBLICATIONS

U.S. Non-Final Office Action dated May 14, 2020 for U.S. Appl. No. 16/272,005; 12 Pages.

Response to U.S. Non-Final Office Action dated May 14, 2020 for U.S. Appl. No. 16/272,005; Response filed Aug. 14, 2020; 17 Pages.

U.S. Final Office Action dated Oct. 28, 2020 for U.S. Appl. No. 16/272,005; 14 Pages.

Response to Final Office Action dated Oct. 28, 2020 for U.S. Appl. No. 16/272,005; Response filed on Jan. 25, 2021; 9 pages.

U.S. Non-Final Office Action dated Mar. 17, 2021 for U.S. Appl. No. 16/272,005; 13 pages.

Response to U.S. Non-Final Office Action dated Mar. 17, 2021 for U.S. Appl. No. 16/272,005; Response filed on Jun. 17, 2021; 10 pages.

U.S. Final Office Action dated Jul. 7, 2021 for U.S. Appl. No. 16/272,005; 11 pages.

U.S. Non-Final Office Action dated Oct. 26, 2021 for U.S. Appl. No. 16/272,005; 12 Pages.

Restriction Requirement dated Oct. 28, 2020 for U.S. Appl. No. 16/740,816; 7 pages.

Response to Restriction Requirement dated Nov. 4, 2020 for U.S. Appl. No. 16/740,816; 1 page.

U.S. Non-Final Office Action dated Nov. 25, 2020 for U.S. Appl. No. 16/740,816; 14 pages.

Response to U.S. Non-Final Office Action dated Nov. 25, 2020 for U.S. Appl. No. 16/740,816; Response filed on Feb. 24, 2021; 10 pages.

U.S. Final Office Action dated May 11, 2021 for U.S. Appl. No. 16/740,816; 14 pages.

Response to Final Office Action dated May 11, 2021 and filed on Aug. 11, 2021 for U.S. Appl. No. 16/740,816; 9 pages.

Notice of Allowance dated Aug. 26, 2021 for U.S. Appl. No. 16/740,816; 11 Pages.

Response to U.S. Final Office Action dated Jul. 7, 2021 for U.S. Appl. No. 16/272,005; Response filed Oct. 6, 2021; 9 Pages.

Response to U.S. Non-Final Office Action dated Oct. 26, 2021 for U.S. Appl. No. 16/272,005; Response filed Jan. 25, 2022; 10 Pages.

U.S. Notice of Allowance dated Feb. 14, 2022 for U.S. Appl. No. 16/272,005; 9 Pages.

* cited by examiner

HALL EFFECT DEVICE WITH TRENCH ABOUT A MICRON OR GREATER IN DEPTH

BACKGROUND

Hall Effect elements that can sense a magnetic field are known. There are several different types of Hall Effect elements, for example, a planar Hall element, a vertical Hall Effect element, and a circular vertical Hall (CVH) element.

As is known, some of the above-described Hall Effect elements tend to have an axis of maximum sensitivity parallel to a substrate that supports the magnetic field sensing element, and others of the above-described Hall Effect elements tend to have an axis of maximum sensitivity perpendicular to a substrate that supports the magnetic field sensing element. In particular, planar Hall elements tend to have axes of sensitivity perpendicular to a substrate, while vertical Hall Effect elements and CVH sensing elements tend to have axes of sensitivity parallel to a substrate.

Sensitivity is one parameter that can be used to characterize each one of the above types of Hall Effect elements. Sensitivity can be expressed, for example, in units of microvolts per Gauss·Volt, i.e., µV/G·V. In general, a high sensitivity is desirable, since the high sensitivity provides a good signal-to-noise ratio for an output signal generated by the Hall Effect element.

SUMMARY

In one aspect, a Hall effect device includes an implantation layer; an epitaxial layer located above the implantation layer the epitaxial layer having a first portion and a second portion; and a trench filled with a dielectric material and extending from a top surface of the epitaxial layer into the implantation layer. The trench is in contact with the second portion of the epitaxial layer and defines an enclosed region. The Hall effect device also includes a buried layer separating the first portion of the epitaxial layer from the implantation layer within the enclosed region and a contact pad located on the epitaxial layer. A current bias on the contact pad generates a current that flows into the first portion of the epitaxial layer and into the implantation layer. The current moves in a vertical direction from the implantation layer through the second portion of the epitaxial layer and the trench reduces the current from traveling in a lateral direction orthogonal to the vertical direction and enables the current to travel in the vertical direction.

In one aspect, a Hall effect device includes an implantation layer; an epitaxial layer located above the implantation layer; a trench filled with a dielectric material and extending from a top surface of the epitaxial layer into the implantation layer and defining an enclosed region; a buried layer the epitaxial layer from the implantation layer within the enclosed region; and a contact pad located on the epitaxial layer. The trench reduces a current from the contact pad from traveling in a lateral direction orthogonal to a vertical direction and enables the current to travel in the vertical direction.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a Hall effect device with a greater trench depth than traditional vertical Hall effect elements. The increased trench depth reduces lateral current thereby increasing vertical current and thereby improving a sensitivity of the vertical Hall effect element to changes in a magnetic field.

The increased trench depth enables the fabrication of novel Hall effect devices. In one example, a Hall effect device may be fabricated that includes four vertical Hall effect elements and one planar Hall effect element (referred to herein as "a three-dimensional (3D) trench Hall effect device"). In another example, a Hall effect device may be fabricated to include a single vertical Hall effect element within a trench (referred to herein as "a two-dimensional (2D) trench vertical Hall effect device") that surrounds the vertical Hall effect element.

Figure 1:
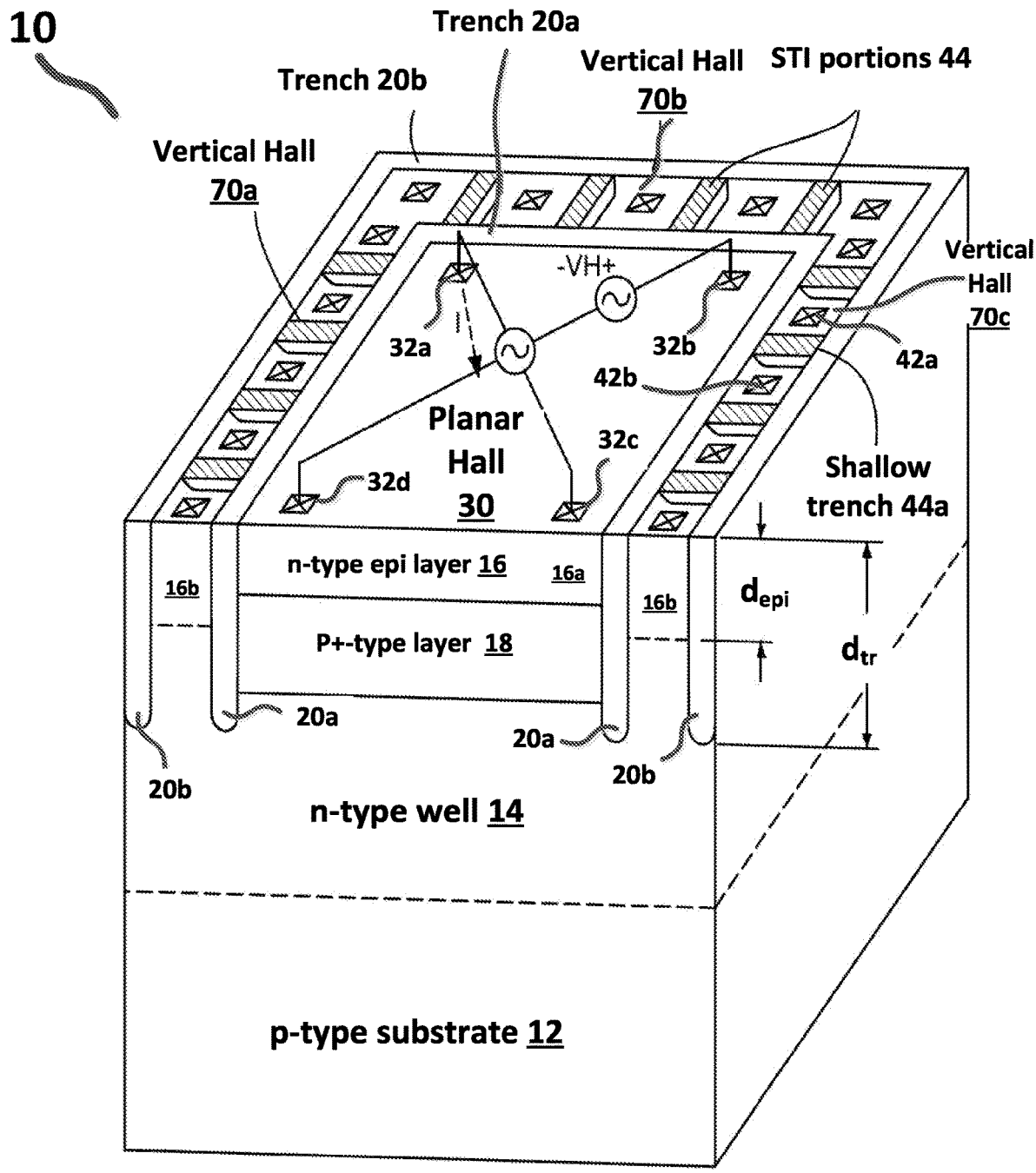
FIG. 1 is a cross-sectional view of an example of a Hall effect device that includes three-dimensional (3D) vertical Hall effect elements and a two-dimensional (2D) planar Hall effect element that includes trenches.

Referring to FIG. 1, an example of a 3D trench Hall effect device is a device 10. The device 10 includes a p-type substrate 12, a n-type well 14 formed within the p-type substrate 10, and an n-type epitaxial layer 16 formed on the n-type well 14. In one example, the n-type epitaxial layer has a depth $d_{epi}$ of at least 8.5 microns±0.5 microns.

In one example, the n-type well 14 may have an N⁻ doping. In one example, the n-type well 14 may be formed through ion implantation and high temperature anneal.

A trench 20a and a trench 20b are formed within the n-type epitaxial layer 16, and the trenches 20a, 20b extend down into the n-type well 14. The trench 20a divides the n-type epitaxial layer into two portions: n-type epitaxial layer portion 16a and n-type epitaxial layer portion 16b.

The trench 20a and the trench 20b are each in a shape of a square with the trench 20a within an area defined by the trench 20b. In one example, the trenches 20a, 20b are filled with dielectric material such as, for example, silicon dioxide and/or polysilicon for electrical isolation.

In one example, a depth $d_{tr}$ of the trench 20a is at least 1 micron±0.5 microns. In one particular example, the depth $d_{tr}$ of the trench 20a is at least 5 microns. In another particular example, the depth $d_{tr}$ of the trench 20a is at least 10 microns. In a further particular example, the depth $d_{tr}$ of the trench 20a is at least 20 microns. In a still further particular example, the depth $d_{tr}$ of the trench 20a is 21 microns±1 micron.

In one example, a depth $d_{tr}$ of the trench 20b is at least 1 micron±0.5 microns. In one particular example, the depth $d_{tr}$ of the trench 20b is at least 5 microns. In another particular example, the depth $d_{tr}$ of the trench 20b is at least 10 microns. In a further particular example, the depth $d_{tr}$ of the trench 20b is at least 20 microns. In a still further particular example, the depth $d_{tr}$ of the trench 20b is at least 21 microns±1 microns.

In one example, the depths $d_{tr}$ of the trenches 20a, 20b are equal. In another example, the depths $d_{tr}$ of the trenches 20a, 20b are not equal. In a further example, the depths $d_{tr}$ of the trenches 20a, 20b are greater than the depth the depth $d_{epi}$ of the n-type epitaxial layer 16.

A P+-type layer 18 is implanted within the square shape formed by the trench 20a. Contact pads (e.g., a contact pad 42a, a contact pad 42b) are formed on a top surface of the device 10. Shallow trench isolation (STI) portions 44 (e.g., a STI portion 44a) extend from the trench 20a to the trench 20b. The STI portions 44 separate the pads from each other. For example, the STI portion 44a separates the pad 32a from the pad 32b. In one example, the STI portions 44 may be a dielectric.

The top surface of the device 10 also includes a 2D planar Hall effect element 30 in the interior of the square of the trench 20a. The planar Hall effect element 30 includes a contact pad 32a, a contact pad 32b, a contact pad 32c, and a contact pad 32d (sometimes called "2D, planar" contact pads).

In one example, a current I may be applied to the contact pads 32a, 32c, and a voltage is measured at the contact pads 32b, 32d. The measured voltage is proportional to an applied magnetic field. In another example not shown, the current I may be applied to the contact pads 32b, 32d and a voltage is measured at the contact pads 32a, 32c. The planar Hall effect element 30 is isolated by the P+ type layer 18 and the trench 20a. In one particular example, the planar Hall effect element 30 is completely isolated by the P+ type layer 18 and the trench 20a.

The depth of the planar Hall effect element 30 is equal to the depth of the n-type epitaxial layer portion 16a. In one example, the depth of the n-type epitaxial layer portion 16a is less than one micron to increase magnetic field sensitivity.

Outside of the square shape formed by the trench 20a and inside the square shape formed by the trench 20b are four vertical Hall effect elements (e.g., a first vertical Hall effect element 70a, a second vertical Hall effect element 70b, a third vertical Hall effect element 70c, and a fourth vertical Hall effect element (not shown)). Each side of the square shape formed by the trench 20a separate one vertical Hall effect element 70a, 70b, 70c from the planar Hall effect element 30.

The device 10 is a symmetrical device in both the x-direction and in the y-direction. This symmetrical configuration reduces offsets that occur in Hall effect elements by applying a spin current method. Thus, the device 10 has a high signal-to-noise and high sensitivity in angle and magnitude of an applied magnetic field in different voltage measurement configurations compared to traditional devices.

The width of vertical Hall device is formed by the two trenches of 20a and 20b. The n-type epitaxial layer portion 16b between the trenches of 20a and 20b may be separated by STI portions 44 and underneath by a p-type layer 318 as shown in FIG. 2.

FIG. 1 is a generalized version of the device 10 in order to better illustrate certain features of the device 10. For example, FIG. 1 includes only three vertical Hall effect elements 70a, 70b, 70c of the four vertical Hall effect elements in order to show a cross-sectional view of the device 10.

Figure 2:
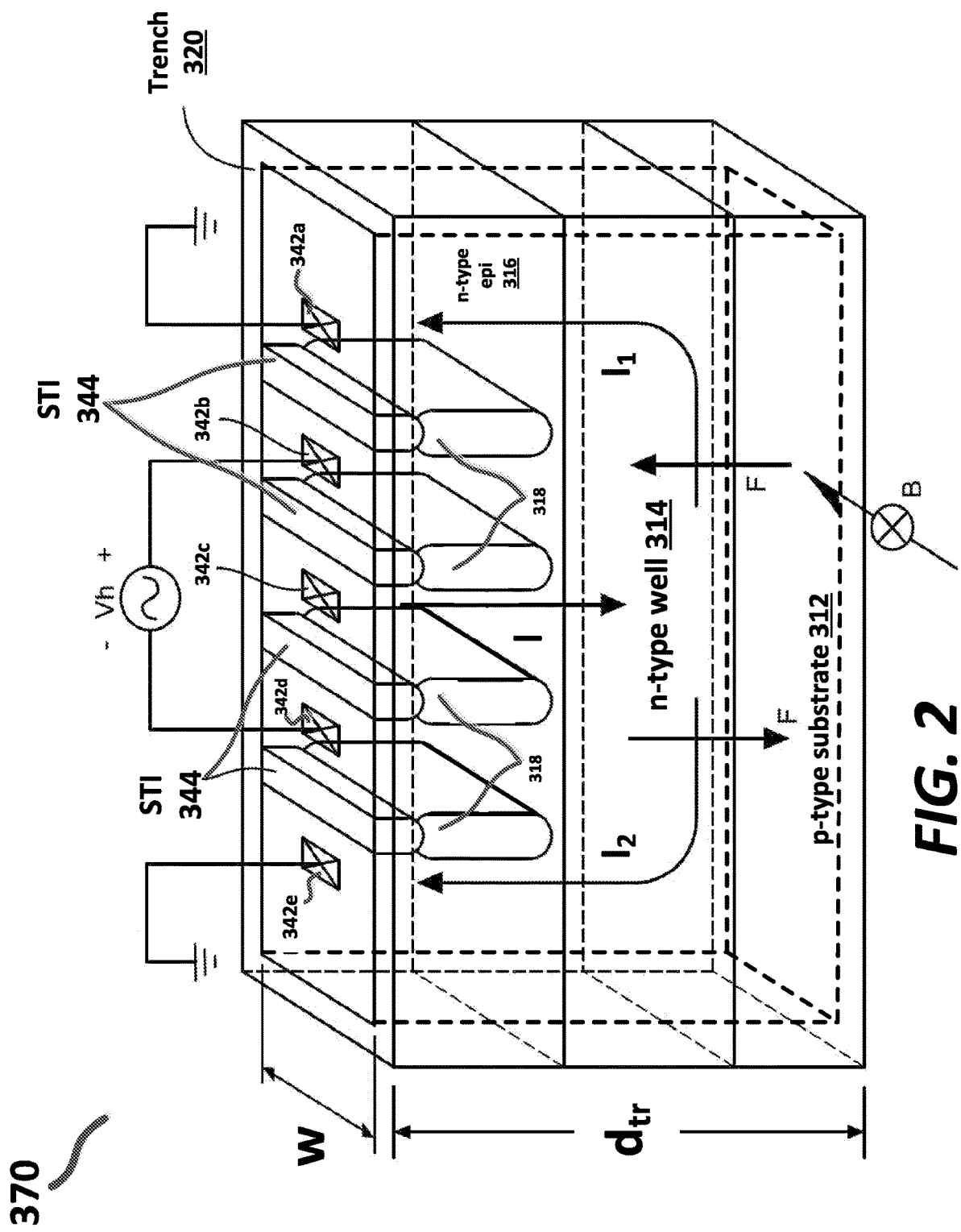
FIG. 2 is a view of an example of a vertical Hall effect element of FIG. 1.

Referring to FIG. 2, an example of a vertical Hall effect element 70a, 70b, 70c (FIG. 1) is a vertical Hall effect device 370. The device 370 includes a p-type substrate 312, a n-type well 314 formed within the p-type substrate 312, and an n-type epitaxial layer 316 formed on the n-type well 314.

In one example, the n-type well 314 may have an N⁻ doping. In one example, the n-type well 314 may be formed through ion implantation and high temperature anneal.

Four p-type layers 318 are implanted in the n-type epitaxial layer 316. Four STI portions 344 are form directly above and in contact with a corresponding one p-type layer 318.

Five contact pads (e.g., a contact pad 342a, a contact pad 342b, a contact pad 342c, a contact pad 342d, a contact pad 342e) are formed on the top surface of the n-type epitaxial layer with one STI portion 344 between two adjacent contact pads 342a-342e.

A trench 320 is formed to enclose the p-type substrate 312, the n-type well 314 and the n-type epitaxial layer. In one example, the device 370 is the same as one of the vertical Hall effect elements 70a, 70b, 70c (FIG. 1). The device 370 may be formed with three contact pads or five contact pads.

The p-type substrate 312, the n-type well 314 and the n-type epitaxial layer 316 have a width w. In one example, the width w is 0.5 to 10 microns±0.2 microns. In one example, a depth $d_{tr}$ of the trench 320 and a depth of the p-type substrate 312, the n-type well 314 and the n-type epitaxial layer are equal. In one example, the depth $d_{tr}$ is at least 21 microns±3 microns.

In one example, the trench 320 is the same as the trench 20a and/or the trench 20b (FIG. 1). In one example, the trench 320 is filled with dielectric material such as, for example, silicon dioxide or polysilicon for electrical isolation.

With an applied magnetic field B, a current I is applied to the contact pad 342c and splits into currents $I_1$ and $I_2$. The current $I_1$ flows to the contact pad 342a and current $I_2$ flows to the contact pad 342e. A corresponding Lorenz force F is formed. The Hall voltage $V_h$ is measured at the contact pads 342b, 342d, which is proportional to the applied magnetic field B. The trench 320 reduces the current flow in the lateral direction and increases the current flow vertically to the contact pads 342a, 342e more than compared to a device that does not include the trench 320.

The embodiments described herein are not limited to the specific examples described. For example, the device 10 may include a trench 20a, but not include the trench 20b (FIG. 1). The doping type may be the opposite for the structures described in device 10 (FIG. 1) and device 370 (FIG. 3). The number of contact pads shown in FIGS. 1 and 2 may be more or less than what is shown or described. The trenches 20a, 20b (FIG. 1) may be circular-shaped rather than square-shaped. The trenches 20a, 20b (FIG. 1) may be equilateral-triangular-shaped. The device 370 (FIG. 3) may be a separate and standalone device separate from the device 10 (FIG. 1). The trench 320 (FIG. 3) may be divided into separate portions to have the same configurations as trenches 20a, 20b (FIG. 1).

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A Hall effect device, comprising:
an implantation layer;
an epitaxial layer having a first portion and a second portion, wherein the implantation layer is below the first portion of the epitaxial layer;
a trench filled with a dielectric material and extending from a top surface of the epitaxial layer into the implantation layer, the trench in contact with the second portion of the epitaxial layer, wherein the trench defines an enclosed region;
wherein the first portion of the epitaxial layer and the implantation layer are surrounded by the trench within the enclosed region, and wherein the first and second portions of the epitaxial layer are on opposite sides of the trench, wherein the Hall effect device comprises vertical Hall elements outside of the enclosed region and the trench and a planar Hall element in the enclosed region,
a well layer abutting the implantation layer in the enclosed region and abutting the second portion of the epitaxial layer for the vertical Hall elements, wherein the trench extends into the well layer;
a substrate under the well layer;
a contact pad located on the epitaxial layer; and
wherein a current bias on the contact pad generates a current that flows into the first portion of the epitaxial layer and into the implantation layer,
wherein the current moves in a vertical direction through the second portion of the epitaxial layer, and
wherein the trench reduces the current from traveling in a lateral direction orthogonal to the vertical direction and enables the current to travel in the vertical direction.

2. The Hall effect device of claim 1, wherein a top surface of the device has the planar Hall effect element.

3. The Hall effect device of claim 1, wherein the trench forms four sides of a square.

4. The Hall effect device of claim 3, wherein the vertical Hall elements comprise four vertical Hall effect elements, wherein each vertical Hall effect element is located on a corresponding one side of the square.

5. The Hall effect device of claim 1, wherein the trench forms a circle.

6. The Hall effect device of claim 1, wherein the trench is more than a micron in depth.

7. The Hall effect device of claim 6, wherein the trench is more than 10 microns in depth.

8. The Hall effect device of claim 7, wherein the trench is more than 20 microns in depth.

9. The Hall effect device of claim 1, wherein the trench is a first trench,
wherein the dielectric material is a first dielectric material;
further comprising a second trench filled with a second dielectric material and extending from the epitaxial layer into the well layer, the second trench being in contact with the second portion of the epitaxial layer opposite the first trench,
wherein the second trench reduces the current from traveling in the lateral direction and enables the current to travel in the vertical direction.

10. The Hall effect device of claim 9, wherein the first dielectric material and the second dielectric material comprise the same material.

11. The Hall effect device of claim 9, wherein the implantation layer has a second-type dopant, and
wherein the epitaxial layer has the second-type dopant.

12. The Hall effect device of claim 11, wherein the first-type dopant is a p-type dopant, and
wherein the second-type dopant is an n-type dopant.

13. The Hall effect device of claim 11, wherein the first-type dopant is a n-type dopant, and
wherein the second-type dopant is an p-type dopant.

14. The Hall effect device of claim 9, wherein the second trench is more than a micron in depth.

15. The Hall effect device of claim 14, wherein the second trench is more than 10 microns in depth.

16. The Hall effect device of claim 15, wherein the second trench is more than 20 microns in depth.

17. The Hall effect device of claim 1, wherein the implantation layer has a second-type dopant, and
wherein the epitaxial layer has the second-type dopant.

18. The Hall effect device of claim 17, wherein the first-type dopant is a p-type dopant, and
wherein the second-type dopant is an n-type dopant.

19. The Hall effect device of claim 17, wherein the first-type dopant is a n-type dopant, and
wherein the second-type dopant is an p-type dopant.

20. The Hall effect device of claim 1, wherein the epitaxial layer is about 8.5 microns in depth.

21. The Hall effect device of claim 1, wherein the epitaxial layer is more doped than the implantation layer is doped.

22. The Hall effect device of claim 1, further comprising:
wherein the vertical Hall elements comprises four vertical Hall effect elements;
wherein the planar Hall effect element is on the top surface of the device; and
wherein the trench separates the four vertical Hall effect elements from the planar Hall effect element;
wherein the trench forms four sides of a square, and
wherein each vertical Hall effect element is located on a corresponding one side of the square.

23. The Hall effect device of claim 22, wherein each vertical Hall effect element includes at least three contact pads.

24. The Hall effect device of claim 1, wherein the dielectric material comprises silicon dioxide and/or polysilicon.

25. The Hall effect device of claim 1, wherein the substrate has a first-type dopant,
wherein the implantation layer is located in the substrate.

26. The Hall effect device of claim 25, wherein the first-type dopant is a p-type dopant, and
wherein the second-type dopant is an n-type dopant.

27. The Hall effect device of claim 25, wherein the first-type dopant is a n-type dopant, and
wherein the second-type dopant is an p-type dopant.

28. The Hall effect device of claim 1, further including STI regions between the vertical Hall elements and respective doped areas implanted in the first portion of the epitaxial layer in contact with the STI regions, wherein the doped areas are doped with a type that is opposite of the dopant type of the first portion of the epitaxial layer.

* * * * *